(12) United States Patent
Frank (10) Patent No.: US 6,600,390 B2
(45) Date of Patent: Jul. 29, 2003

(54) DIFFERENTIAL FILTERS WITH COMMON MODE REJECTION AND BROADBAND REJECTION

(75) Inventor: Michael Louis Frank, Los Gatos, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 18 days.

(21) Appl. No.: 10/017,605

(22) Filed: Dec. 13, 2001

(65) Prior Publication Data

US 2003/0112098 A1 Jun. 19, 2003

(51) Int. Cl.⁷ .............................. H03H 9/54; H03H 9/64
(52) U.S. Cl. ...................... 333/189; 333/190; 333/193
(58) Field of Search ................................ 333/186–196; 310/313 R, 313 B, 313 C, 313 D (56) References Cited

U.S. PATENT DOCUMENTS 5,231,327 A * 7/1993 Ketcham ..................... 310/366
5,789,845 A * 8/1998 Wadaka et al. ............. 310/334
5,910,756 A * 6/1999 Ella ............................ 333/133

FOREIGN PATENT DOCUMENTS

| JP | 10-335978 | * | 12/1998 |
| JP | 11-284487 | * | 10/1999 |
| JP | 11-284488 | * | 10/1999 |
| JP | 11-346142 | * | 12/1999 |
| JP | 2000-22493 | * | 1/2000 |
| JP | 2000-196412 | * | 7/2000 |
| JP | 2001-7680 | * | 1/2001 |
| JP | 2001-223554 | * | 8/2001 |
| JP | 2002-33642 | * | 1/2002 |

* cited by examiner

Primary Examiner—Barbara Summons (57) ABSTRACT

A differential filter includes a first input, a second input, a first output, a second output, and a plurality of acoustic resonator elements. The plurality of acoustic resonator elements is connected to the first input, the second input, the first output and the second output. The acoustic resonator elements are arranged to form at least two of a lattice structure, a full ladder structure and a paired half ladder structure.

19 Claims, 5 Drawing Sheets

DIFFERENTIAL FILTERS WITH COMMON MODE REJECTION AND BROADBAND REJECTION

BACKGROUND

The present invention concerns circuits used for communication systems and pertains specifically to differential filters with common mode rejection and broadband rejection.

For applications such as cellular phones, it is desirable to reduce the size of components. Particularly, it is desirable to integrate RF duplexers and filters as part of a radio-on-a-chip with a readily manufactured technology.

Bulk acoustic resonators have been used to implement filters. One advantage of using acoustic resonators is that the speed of sound is approximately three or four orders of magnitude smaller than the speed of light, making the wavelengths, and thus the dimensions of a device, small compared with conventional (L-C) tank circuits.

There are two broad classes of circuits: single ended and balanced. Single ended filter circuits respond to a signal that is referenced to ground. Balanced filter circuits respond preferentially to signals that reference to each other.

There are numerous ways to balance circuits. For example, a circuit structure can be built with three phases (modes). Three phase power delivery is done in one of two manners, Wye (Y) and delta (Δ). For delta manner phase power delivery, power is delivered on three lines. There is no ground node. All voltages are defined with respect to each other. Each of the signals on the three lines is 120 degrees out of phase with respect to the signals on the other two lines.

For Wye manner phase power delivery, a ground is located close enough to induce currents from the transmission lines. When a single phase is pulled off, a parasitic Wye mode becomes defined. So, Wye mode can be used to deliver single ended power out of a power line. However, a Wye mode can be formed as a parasitic mode in lines formed in a Wye formation. It is also possible to build a balanced circuit structure with only two phases. Such a circuit is called a differential circuit. In this case, signals on two lines are 180 degrees out of phase. When the two signals are not balanced, then the extra energy shows up as a single ended term called the common mode. Effectively, each of the otherwise out-of-phase signals have some inphase energy as well. The common mode does not have to be the same frequency as the differential mode.

There are two sources of common mode. The network itself may not be symmetric, with the resulting unbalance causing common mode. This is typical in a passive structure. And if the input signal is not completely balanced then there will be common mode in proportion to this lack of balance. This lack of balance at the input can be compensated for within the network, as is typical with an integrated circuit, such as a differential amplifier. Specifically, this balance can be restored through common mode rejection. For a general discussion of common mode rejection, see for example, Paul Gray and Robert Meyer, "Analysis and Design of Analog Integrated Circuits", $2^{nd}$ edition, Wiley, 1977, 1984.

There are equivalently single ended and balanced bandpass filters. There are many forms of single ended filters. If limited to two dimensional, resonator based, such as filters that use film bulk acoustic resonators (FBARs), the number of forms is greatly reduced. The basic structure is a half ladder.

A filter using a half ladder structure can be significantly enhanced through various forms of coupling. Coupling paths can be around series elements. Coupling paths can be between shunt elements. Coupling paths can be between series and shunt elements. The coupling can be either capacitive or inductive. The capacitive coupling is due either to the proximity of printed metal lines, by design or as an unwanted parasitic, or from a directly formed capacitor. The inductive coupling can be the result of both bond wire and printed metal line proximity, also either by design or as an unwanted parasitic. These modifications can modify the slope and passband width, but do not change the basic shape of the filter response.

A similarly fabricated differential filter typically has one of three main structures. The first structure is a pair two identical half ladders (also called a paired half ladder structure). A second structure is a full ladder structure. A third structure for a differential filter is a lattice structure.

Each different differential filter structure has advantages and disadvantages. The frequency response of a differential filter with a ladder structure is quite different than the frequency response of a differential filter with a lattice structure. A differential filter with a ladder structure tends to have a very steep rejection response, followed by a return to less rejection. A differential filter with a ladder structure is typically quite effective in blocking signals close to the passband, but poor at rejecting further frequencies. A differential filter with a lattice structure rejects very well for frequencies further from the passband, but not well for frequencies closer to the passband.

Differential filters have both differential and common mode responses. Differential filters with full ladder structures and differential filters with lattice structures generally do not respond well to common mode signals. Differential filters with full ladder structures and differential filters with lattice structures are completely symmetric, and so do not contribute directly to common mode. However, differential filters with full ladder structures and differential filters with lattice structures have no provision for rejecting common mode that is already contained within the input signal. Typically, there is significant imbalance at the input to any network.

Differential filters with paired half ladder structures reject common mode directly. However, differential filters with paired half ladder structures are really two separate filters and it is difficult to balance two separate filters. The imbalance results in more common mode. The difficulty in balancing two half ladder structures is compounded by the nature of a half ladder structure. Each shunt element is grounded, individually. The ground paths are dependent upon geometry, and so it is difficult to make these ground paths identical. The inductance in the path to ground has an effect, reducing the slope of the transition from passband to reject band. This effect can be either useful or detrimental, depending upon the filter requirements.

SUMMARY OF THE INVENTION

In accordance with the preferred embodiment of the present invention, a differential filter includes a first input, a second input, a first output, a second output, and a plurality of acoustic resonator elements. The plurality of acoustic resonator elements is connected to the first input, the second input, the first output and the second output. The acoustic resonator elements are arranged to form both a lattice structure and a full ladder structure. In alternate embodiments of the present invention, the acoustic resonator elements are arranged to form both a full ladder structure and a paired half ladder structure, to form both a lattice structure and a paired half ladder structure, or to form all of a lattice structure, a full ladder structure and a paired half ladder structure.

DESCRIPTION OF THE PREFERRED EMBODIMENT

Figure 1:
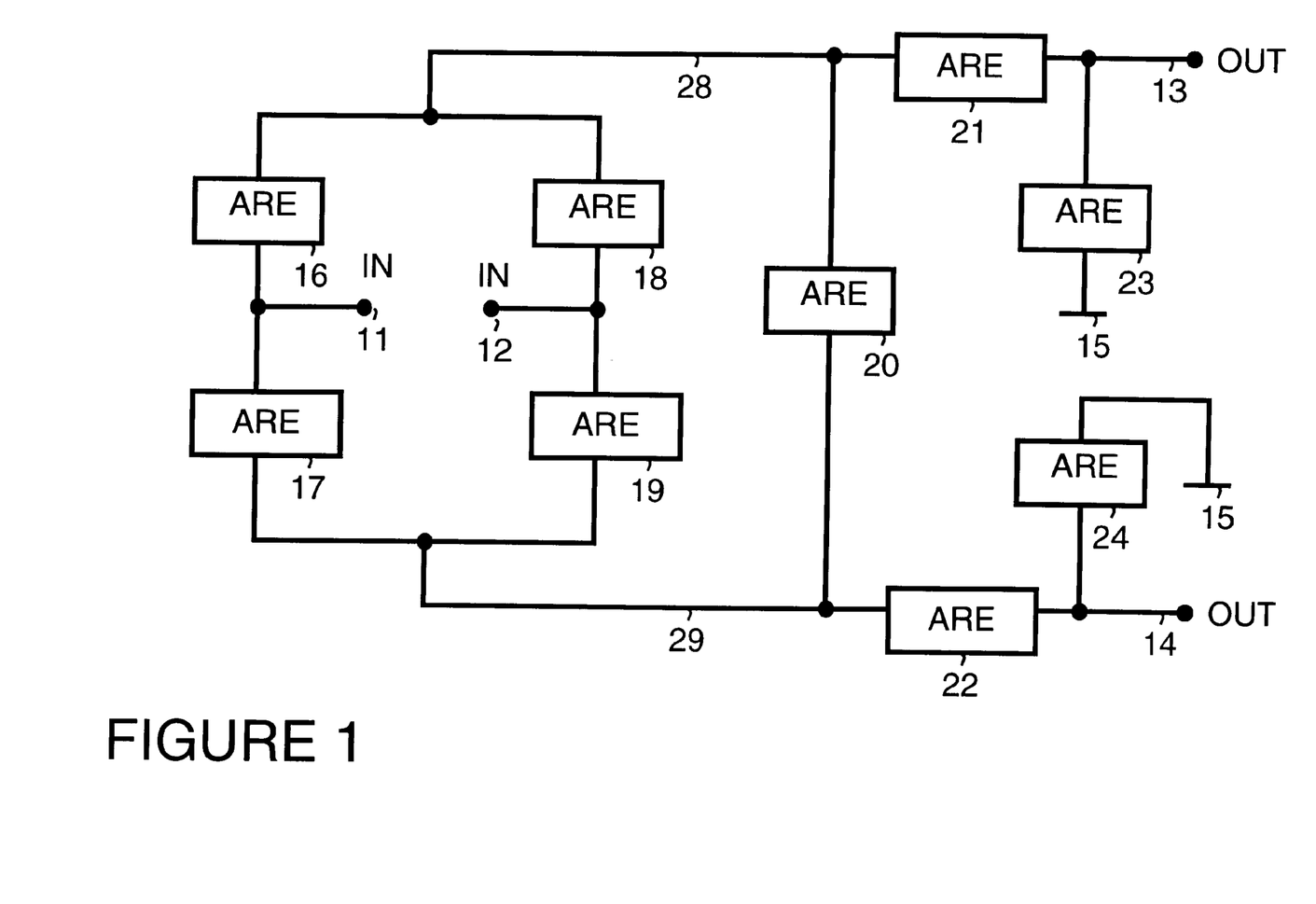
FIG. 1 is a simplified block diagram of a differential filter circuit that includes a lattice structure segment, a full ladder structure segment and a paired half ladder structure segment in accordance with a preferred embodiment of the present invention.

FIG. 1 is a simplified block diagram of a differential filter circuit. The differential filter circuit includes an input 11, an input 12, an output 13 and an output 14. The differential filter circuit also includes an acoustic resonator element (ARE) 16, an acoustic resonator element 17, an acoustic resonator element 18, an acoustic resonator element 19, an acoustic resonator element 20, an acoustic resonator element 21, an acoustic resonator element 22, an acoustic resonator element 23 and an acoustic resonator element 24 connected as shown. For example, each acoustic resonator element is a film bulk acoustic resonator (FBAR). Alternatively, each acoustic resonator element can be another type of acoustic resonator element such as a surface acoustic wave (SAW) element.

With the differential filter circuit shown in FIG. 1, acoustic resonator elements 16 through 24 are arranged to form a lattice structure, a full ladder structure and a paired half ladder structure.

The lattice structure is formed by acoustic resonator elements 16, 17, 18 and 19. A lattice structure is a structure in which at least one acoustic resonator element is connected in a series connection between every input and every output of the lattice structure. Thus in FIG. 1, ARE 16 is connected between input 11 and a structure output (node 28). ARE 17 is connected between input 11 and a structure output (node 29). ARE 18 is connected between input 12 and structure output 28. ARE 19 is connected between input 12 and structure output 29.

The full ladder structure is formed by acoustic resonator elements 20, 21 and 22. Node 28 acts as a first input to the full ladder structure. Node 29 acts as a second input to the full ladder structure. Output 13 acts as a first output to the full ladder structure. Output 14 acts as a second output to the full ladder structure.

A full ladder structure is a structure in which at least one acoustic resonator element is connected between a first input and a first output of the structure, at least one acoustic resonator element is connected between a second input and a second output of the structure, and at least one acoustic resonator is connected in a shunt connection between one end of an acoustic resonator connected between the first input and the first output of the full ladder structure and one end of an acoustic resonator connected between the second input and the second output of the full ladder structure.

In FIG. 1, ARE 21 is connected between full ladder structure input 28 and full ladder structure output 13. ARE 22 is connected between full ladder structure input 29 and full ladder structure output 14. ARE 20 is connected between one end of ARE 21 and one end of ARE 22.

The paired half ladder structure is formed by acoustic resonator elements 21, 22, 23 and 24. Node 28 acts as a first input to the paired half ladder structure. Node 29 acts as a second input to the paired half ladder structure. Output 13 acts as a first output to the paired half ladder structure. Output 14 acts as a second output to the paired half ladder structure.

A paired half ladder structure is a structure in which at least one acoustic resonator element is connected between a first input and a first output of the structure, at least one acoustic resonator element is connected between a second input and a second output of the structure, at least one acoustic resonator is connected in a shunt connection between a reference voltage and one end of an acoustic resonator connected between the first input and the first output of the paired half ladder structure, and at least one acoustic resonator is connected in a shunt connection between the reference voltage and one end of an acoustic resonator connected between the second input and the second output of the paired half ladder structure.

In FIG. 1, ARE 21 is connected between paired half ladder structure input 28 and paired half ladder structure output 13. ARE 22 is connected between paired half ladder structure input 29 and paired half ladder structure output 14. ARE 23 is connected between a reference voltage 15 and one end of ARE 21. ARE 24 is connected between a reference voltage 15 and one end of ARE 22.

The differential filter shown in FIG. 1 has both ladder and lattice rejection characteristics, and has the common mode performance of the paired half ladder. FIG. 1 thus combines differential and common mode rejection in a single circuit. The half ladder structure provides common mode rejection. At least one paired half ladder is required for common mode rejection.

The differential rejection for the differential filter shown in FIG. 1 is provided by the full ladder structure and the lattice structure. In general, one or more full ladder sections, one or more lattice sections, or some combination of full ladder sections and lattice sections are required to provide differential rejection.

It is additionally of note that the differential filter shown in FIG. 1 provides rejection with the combination of the ladder characteristic and the lattice characteristic. To provide this type of rejection requires at least one lattice section, and either one or more paired half ladders, one or more full ladder sections, or one or more of each a paired half ladder section and full ladder section.

FIG. 1 is just one embodiment of a differential filter that contains the features of the present invention. For example, the differential filter shown in FIG. 1 could include additional lattice sections, additional paired half-ladder sections and/or additional full ladder sections. One example of this is shown in FIG. 2 below.

Figure 2:
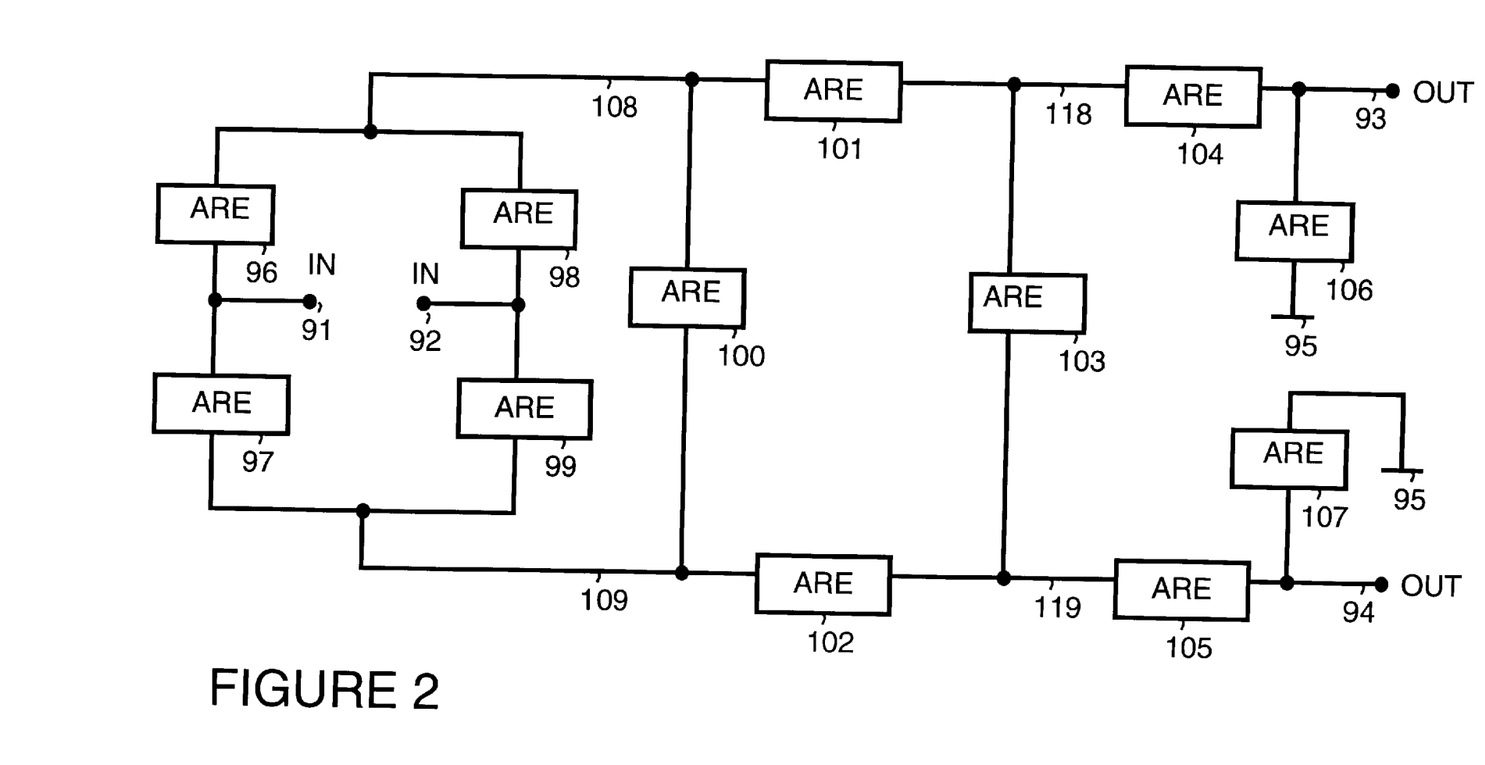
FIG. 2 is a simplified block diagram of a differential filter circuit that includes a lattice structure segment, a full ladder structure segment and a paired half ladder structure segment in accordance with a preferred embodiment of the present invention.

FIG. 2 is a simplified block diagram of a differential filter circuit. The differential filter circuit includes an input 91, an input 92, an output 93 and an output 94. The differential filter circuit also includes an acoustic resonator element (ARE) 96, an acoustic resonator element 97, an acoustic resonator element 98, an acoustic resonator element 99, an acoustic resonator element 100, an acoustic resonator element 101, an acoustic resonator element 102, an acoustic resonator element 103, an acoustic resonator element 104, an acoustic resonator element 105, an acoustic resonator element 106, and an acoustic resonator element 107 connected as shown. For example, each acoustic resonator element is a film bulk acoustic resonator (FBAR). Alternatively, each acoustic resonator element can be another type of acoustic resonator element such as a surface acoustic wave (SAW) element.

With the differential filter circuit shown in FIG. 2, acoustic resonator elements 96 through 107 are arranged to form a lattice structure, a full ladder structure and a paired half ladder structure.

The lattice structure is formed by acoustic resonator elements 96, 97, 98 and 99. A lattice structure is a structure in which at least one acoustic resonator element is connected in a series connection between every input and every output of the lattice structure. Thus in FIG. 2, ARE 96 is connected between input 91 and a structure output (node 108). ARE 97 is connected between input 91 and a structure output (node 109). ARE 98 is connected between input 92 and structure output 108. ARE 99 is connected between input 92 and structure output 109.

The full ladder structure (including two full ladder sections) is formed by acoustic resonator elements 100, 101, 102, 103, 104 and 105. Node 108 acts as a first input to the full ladder structure. Node 109 acts as a second input to the full ladder structure. Output 93 acts as a first output to the full ladder structure. Output 94 acts as a second output to the full ladder structure.

A full ladder structure is a structure in which at least one acoustic resonator element is connected between a first input and a first output of the structure, at least one acoustic resonator element is connected between a second input and a second output of the structure, and at least one acoustic resonator is connected in a shunt connection between one end of an acoustic resonator connected between the first input and the first output of the full ladder structure and one end of an acoustic resonator connected between the second input and the second output of the full ladder structure.

In FIG. 2, ARE 101 and ARE 104 are connected between full ladder structure input 108 and full ladder structure output 93. ARE 102 and ARE 105 are connected between full ladder structure input 109 and full ladder structure output 94. ARE 100 is connected between one end of ARE 101 and one end of ARE 102. ARE 103 is connected between one end of ARE 104 and one end of ARE 105.

The paired half ladder structure is formed by acoustic resonator elements 104, 105, 106 and 107. Node 118 acts as a first input to the paired half ladder structure. Node 119 acts as a second input to the paired half ladder structure. Output 93 acts as a first output to the paired half ladder structure. Output 94 acts as a second output to the paired half ladder structure.

A paired half ladder structure is a structure in which at least one acoustic resonator element is connected between a first input and a first output of the structure, at least one acoustic resonator element is connected between a second input and a second output of the structure, at least one acoustic resonator is connected in a shunt connection between a reference voltage and one end of an acoustic resonator connected between the first input and the first output of the paired half ladder structure, and at least one acoustic resonator is connected in a shunt connection between the reference voltage and one end of an acoustic resonator connected between the second input and the second output of the paired half ladder structure.

In FIG. 2, ARE 104 is connected between paired half ladder structure input 118 and paired half ladder structure output 93. ARE 105 is connected between paired half ladder structure input 119 and paired half ladder structure output 94. ARE 106 is connected between a reference voltage 95 and one end of ARE 104. ARE 107 is connected between a reference voltage 95 and one end of ARE 105.

The differential filter shown in FIG. 2 has both ladder and lattice rejection characteristics, and has the common mode performance of the paired half ladder. FIG. 2 thus combines differential and common mode rejection in a single circuit. The half ladder structure provides common mode rejection.

Figure 3:
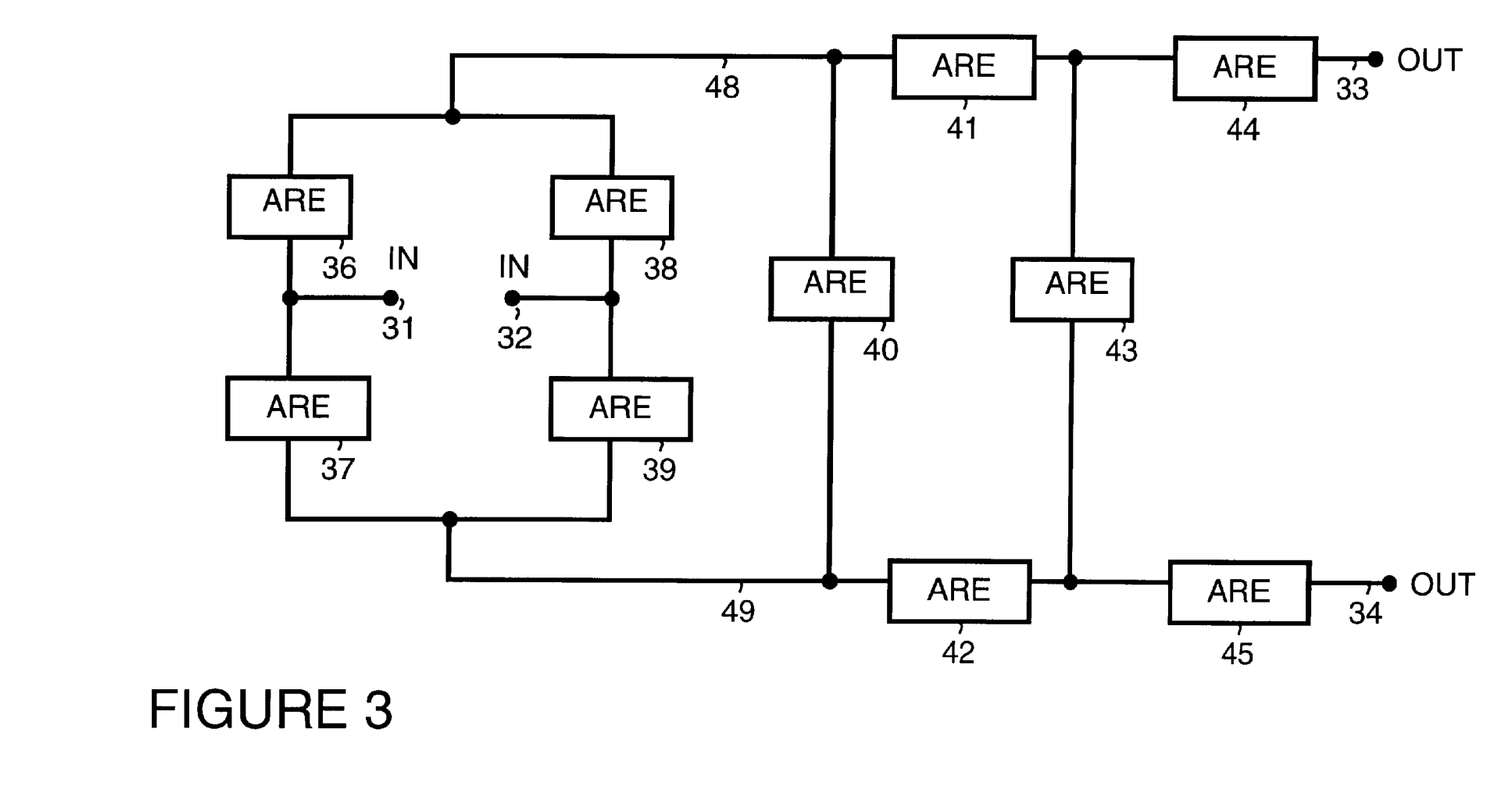
FIG. 3 is a simplified block diagram of a differential filter circuit that includes a lattice structure segment, and a full ladder structure segment in accordance with a preferred embodiment of the present invention.

FIG. 3 is a simplified block diagram of a differential filter circuit that includes a lattice structure segment, and a full ladder structure segment. The differential filter circuit includes an input 31, an input 32, an output 33 and an output 34. The differential filter circuit also includes an acoustic resonator element (ARE) 36, an acoustic resonator element 37, an acoustic resonator element 38, an acoustic resonator element 39, an acoustic resonator element 40, an acoustic resonator element 41, an acoustic resonator element 42, an acoustic resonator element 43, an acoustic resonator element 44 and an acoustic resonator element 45 connected as shown. For example, each acoustic resonator element is a film bulk acoustic resonator (FBAR). Alternatively, each acoustic resonator element can be another type of acoustic resonator element such as a surface acoustic wave (SAW) element.

Within the differential filter circuit shown in FIG. 3, acoustic resonator elements 36 through 45 are arranged to form a lattice structure and a full ladder structure.

The lattice structure is formed by acoustic resonator elements 36, 37, 38 and 39. A lattice structure is a structure in which at least one acoustic resonator element is connected in a series connection between every input and every output of the lattice structure. Thus in FIG. 3, ARE 36 is connected between input 31 and a structure output (node 48). ARE 37 is connected between input 31 and a structure output 49 (node 49). ARE 38 is connected between input 32 and structure output 48. ARE 39 is connected between input 32 and structure output 49.

The full ladder structure is formed by acoustic resonator elements 40, 41, 42, 43, 44 and 45. Node 48 acts as a first input to the full ladder structure. Node 49 acts as a second input to the full ladder structure. Output 33 acts as a first output to the full ladder structure. Output 34 acts as a second output to the full ladder structure.

A full ladder structure is a structure in which at least one acoustic resonator element is connected between a first input and a first output of the structure, at least one acoustic resonator element is connected between a second input and a second output of the structure, and at least one acoustic resonator is connected in a shunt connection between one end of an acoustic resonator connected between the first input and the first output of the full ladder structure and one end of an acoustic resonator connected between the second input and the second output of the full ladder structure.

In FIG. 3, ARE 41 and ARE 44 are connected between full ladder structure input 48 and full ladder structure output 33. ARE 42 and ARE 45 are connected between full ladder structure input 49 and full ladder structure output 34. ARE 40 is connected between one end of ARE 41 and one end of ARE 42. ARE 43 is connected between one end of ARE 44 and one end of ARE 45.

The differential filter shown in FIG. 3 has both ladder and lattice rejection characteristics.

Figure 4:
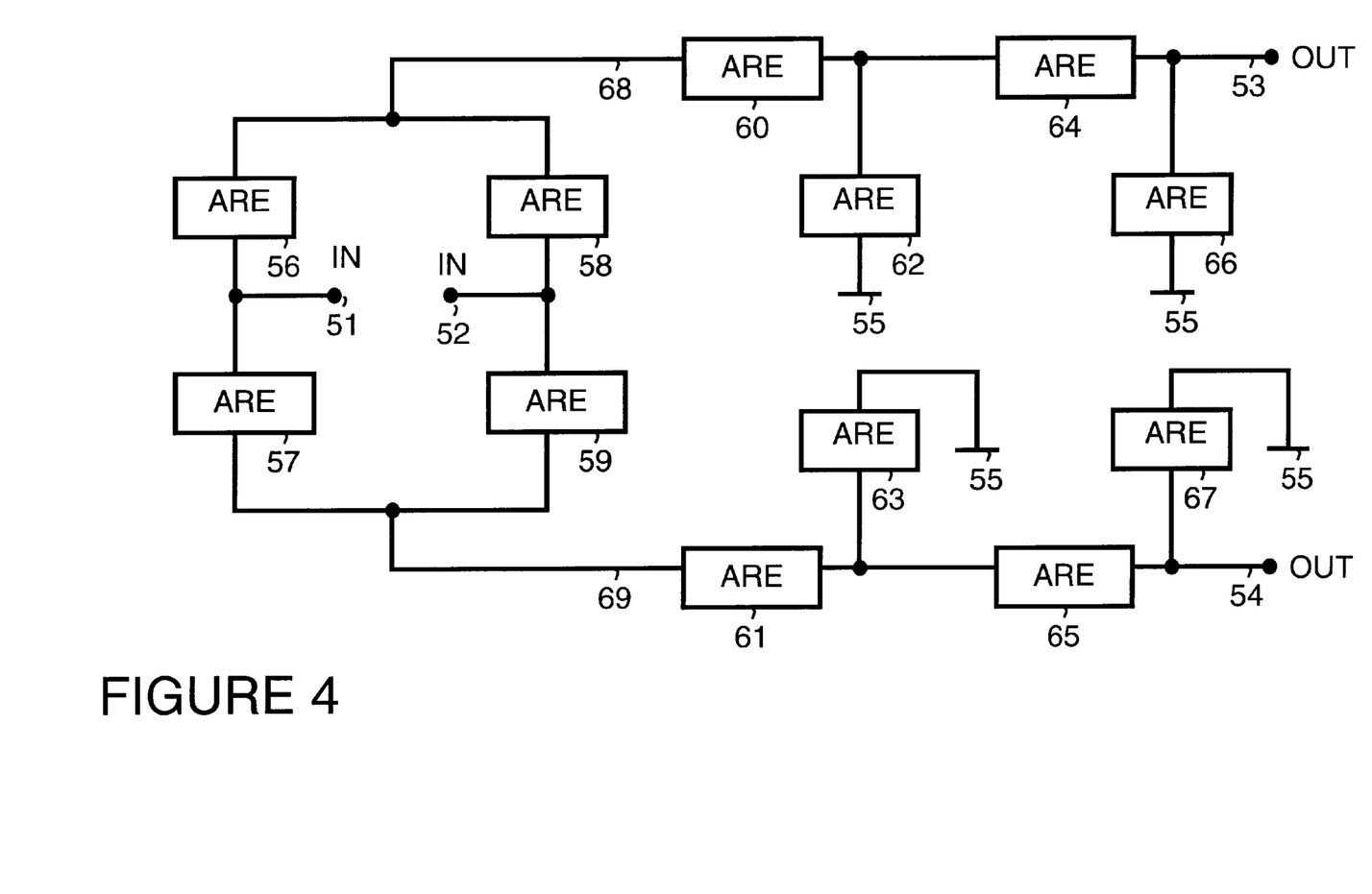
FIG. 4 is a simplified block diagram of a differential filter circuit that includes a lattice structure segment and a paired half ladder structure segment in accordance with a preferred embodiment of the present invention.

FIG. 4 is a simplified block diagram of a differential filter circuit that includes a lattice structure segment, and a paired half ladder structure segment. The differential filter circuit includes an input 51, an input 52, an output 53 and an output 54. The differential filter circuit also includes an acoustic resonator element (ARE) 56, an acoustic resonator element 57, an acoustic resonator element 58, an acoustic resonator element 59, an acoustic resonator element 60, an acoustic resonator element 61, an acoustic resonator element 62, an acoustic resonator element 63, an acoustic resonator element 64, an acoustic resonator element 65, an acoustic resonator element 66 and an acoustic resonator element 67 connected as shown. For example, each acoustic resonator element is a film bulk acoustic resonator (FBAR). Alternatively, each acoustic resonator element can be another type of acoustic resonator element such as a surface acoustic wave (SAW) element.

Within the differential filter circuit shown in FIG. 4, acoustic resonator elements 56 through 67 are arranged to form a lattice structure and a paired half ladder structure.

The lattice structure is formed by acoustic resonator elements 56, 57, 58 and 59. A lattice structure is a structure in which at least one acoustic resonator element is connected in a series connection between every input and every output of the lattice structure. Thus in FIG. 4, ARE 56 is connected between input 51 and a structure output (node 68). ARE 57 is connected between input 51 and a structure output (node 69). ARE 58 is connected between input 52 and structure output 68. ARE 59 is connected between input 52 and structure output 69.

The paired half ladder structure is formed by acoustic resonator elements 60, 61, 62, 63, 64, 65, 66 and 67. Node 68 acts as a first input to the paired half ladder structure. Node 69 acts as a second input to the paired half ladder structure. Output 53 acts as a first output to the paired half ladder structure. Output 54 acts as a second output to the paired half ladder structure.

A paired half ladder structure is a structure in which at least one acoustic resonator element is connected between a first input and a first output of the structure, at least one acoustic resonator element is connected between a second input and a second output of the structure, at least one acoustic resonator is connected in a shunt connection between a reference voltage and one end of an acoustic resonator connected between the first input and the first output of the paired half ladder structure, and at least one acoustic resonator is connected in a shunt connection between the reference voltage and one end of an acoustic resonator connected between the second input and the second output of the paired half ladder structure.

In FIG. 4, ARE 60 and ARE 64 are connected between paired half ladder structure input 68 and paired half ladder structure output 53. ARE 61 and ARE 65 are connected between paired half ladder structure input 69 and paired half ladder structure output 54. ARE 62 is connected between a reference voltage 55 and one end of ARE 60. ARE 63 is connected between reference voltage 55 and one end of ARE 61. ARE 66 is connected between reference voltage 55 and one end of ARE 64. ARE 67 is connected between reference voltage 55 and one end of ARE 65.

The differential filter shown in FIG. 4 has both ladder and lattice rejection characteristics, and has the common mode performance of the paired half ladder. FIG. 4 thus combines differential and common mode rejection characteristics in a single differential filter circuit.

Figure 5:
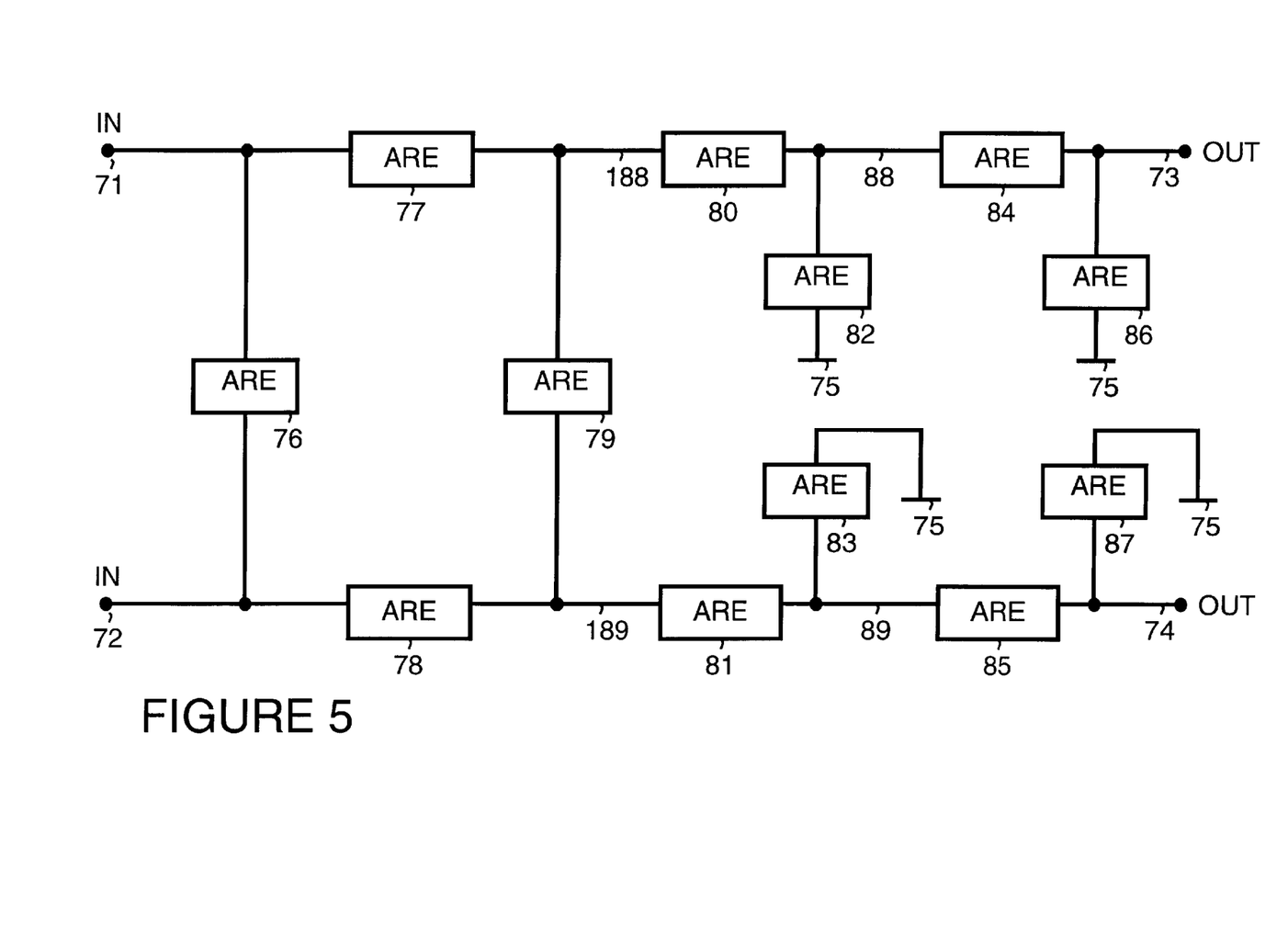
FIG. 5 is a simplified block diagram of a differential filter circuit that includes a full ladder structure segment and a paired half ladder structure segment in accordance with a preferred embodiment of the present invention.

FIG. 5 is a simplified block diagram of a differential filter circuit that includes a full ladder structure segment, and a paired half ladder structure segment. The differential filter circuit includes an input 71, an input 72, an output 73 and an output 74. The differential filter circuit also includes an acoustic resonator element (ARE) 76, an acoustic resonator element 77, an acoustic resonator element 78, an acoustic resonator element 79, an acoustic resonator element 80, an acoustic resonator element 81, an acoustic resonator element 82, an acoustic resonator element 83, an acoustic resonator element 84, an acoustic resonator element 85, an acoustic resonator element 86 and an acoustic resonator element 87 connected as shown. For example, each acoustic resonator element is a film bulk acoustic resonator (FBAR). Alternatively, each acoustic resonator element can be another type of acoustic resonator element such as a surface acoustic wave (SAW) element.

Within the differential filter circuit shown in FIG. 5, acoustic resonator elements 76 through 87 are arranged to form a full ladder structure and a paired half ladder structure.

The full ladder structure is formed by acoustic resonator elements 76, 77, 78, 79, 80 and 81. Input 71 acts as a first input to the full ladder structure. Input 72 acts as a second input to the full ladder structure. Node 88 acts as a first output to the full ladder structure. Node 89 acts as a second output to the full ladder structure.

A full ladder structure is a structure in which at least one acoustic resonator element is connected between a first input and a first output of the structure, at least one acoustic resonator element is connected between a second input and a second output of the structure, and at least one acoustic resonator is connected in a shunt connection between one end of an acoustic resonator connected between the first input and the first output of the full ladder structure and one end of an acoustic resonator connected between the second input and the second output of the full ladder structure.

In FIG. 5, ARE 77 and ARE 80 are connected between full ladder structure input 71 and full ladder structure output 88. ARE 78 and ARE 81 are connected between full ladder structure input 72 and full ladder structure output 89. ARE 76 is connected between one end of ARE 77 and one end of ARE 78. ARE 79 is connected between one end of ARE 80 and one end of ARE 81.

The paired half ladder structure is formed by acoustic resonator elements 80, 81, 82, 83, 84, 85, 86 and 87. Node 188 acts as a first input to the paired half ladder structure. Node 189 acts as a second input to the paired half ladder structure. Output 73 acts as a first output to the paired half ladder structure. Output 74 acts as a second output to the paired half ladder structure.

A paired half ladder structure is a structure in which at least one acoustic resonator element is connected between a first input and a first output of the structure, at least one acoustic resonator element is connected between a second input and a second output of the structure, at least one acoustic resonator is connected in a shunt connection between a reference voltage and one end of an acoustic resonator connected between the first input and the first output of the paired half ladder structure, and at least one acoustic resonator is connected in a shunt connection between the reference voltage and one end of an acoustic resonator connected between the second input and the second output of the paired half ladder structure.

In FIG. 5, ARE 80 and ARE 84 are connected between paired half ladder structure input 188 and paired half ladder structure output 73. ARE 81 and ARE 85 are connected between paired half ladder structure input 189 and paired half ladder structure output 74. ARE 82 is connected between a reference voltage 75 and one end of ARE 80. ARE 83 is connected between reference voltage 75 and one end of ARE 81. ARE 86 is connected between reference voltage 75 and one end of ARE 84. ARE 87 is connected between reference voltage 75 and one end of ARE 85.

The differential filter shown in FIG. 5 has full ladder rejection characteristics, and has the common mode performance of the paired half ladder. FIG. 5 thus combines differential and common mode rejection characteristics in a single differential filter circuit.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

I claim:

1. A differential filter comprising:
    a first input;
    a second input;
    a first output;
    a second output; and,
    a plurality of acoustic resonator elements, coupled to the first input, the second input, the first output and the second output, the acoustic resonator elements being arranged to form both a lattice structure and a full ladder structure.

2. A differential filter as in claim 1 additionally comprising a reference voltage input coupled to the plurality of acoustic resonator elements, wherein the acoustic resonator elements are additionally arranged to form a paired half ladder structure.

3. A differential filter as in claim 1 wherein each of the acoustic resonator elements is a film bulk acoustic resonator (FBAR).

4. A differential filter as in claim 1 wherein each of the acoustic resonator elements is a surface acoustic wave (SAW) element.

5. A differential filter as in claim 1 additionally comprising a reference voltage input coupled to the plurality of acoustic resonator elements, wherein the acoustic resonator elements are additionally arranged to form a paired half ladder structure, the plurality of acoustic resonator elements including:
    a first acoustic resonator element connected between the first input and a first node;
    a second acoustic resonator element connected between the first input and the second node;
    a third acoustic resonator element connected between the second input and the first node;
    a fourth acoustic resonator element connected between the second input and the second node;
    a fifth acoustic resonator element connected between the first node and the second node;
    a sixth acoustic resonator element connected between the first output and the first node;
    a seventh acoustic resonator element connected between the second output and the second node;
    an eighth acoustic resonator element connected between the first output and the reference voltage input; and,
    a ninth acoustic resonator element connected between the second output and the reference voltage input.

6. A differential filter as in claim 1 additionally comprising a reference voltage input coupled to the plurality of acoustic resonator elements, wherein the acoustic resonator elements are additionally arranged to form a paired half ladder structure, the plurality of acoustic resonator elements including:
    a first acoustic resonator element connected between the first input and a first node;
    a second acoustic resonator element connected between the first input and the second node;
    a third acoustic resonator element connected between the second input and the first node;
    a fourth acoustic resonator element connected between the second input and the second node;
    a fifth acoustic resonator element connected between the first node and the second node;
    a sixth acoustic resonator element connected between the first node and a third node;
    a seventh acoustic resonator element connected between the second node and a fourth node;
    an eighth acoustic resonator element connected between the third node and the fourth node;
    a ninth acoustic resonator element connected between the first output and the third node;
    a tenth acoustic resonator element connected between the second output and the fourth node;
    an eleventh acoustic resonator element connected between the first output and the reference voltage input; and,
    a twelfth acoustic resonator element connected between the second output and the reference voltage input.

7. A differential filter as in claim 1 wherein the plurality of acoustic resonator elements include:
    a first acoustic resonator element connected between the first input and a first node;
    a second acoustic resonator element connected between the first input and the second node;
    a third acoustic resonator element connected between the second input and the first node;
    a fourth acoustic resonator element connected between the second input and the second node;
    a fifth acoustic resonator element connected between the first node and the second node;
    a sixth acoustic resonator element connected between the first output and the first node; and,
    a seventh acoustic resonator element connected between the second output and the second node.

8. A differential filter as in claim 1 wherein the plurality of acoustic resonator elements include:
    a first acoustic resonator element connected between the first input and a first node;
    a second acoustic resonator element connected between the first input and the second node;
    a third acoustic resonator element connected between the second input and the first node;

a fourth acoustic resonator element connected between the second input and the second node;

a fifth acoustic resonator element connected between the first node and the second node;

a sixth acoustic resonator element connected between the first node and a third node;

a seventh acoustic resonator element connected between the second node and a fourth node;

an eighth acoustic resonator element connected between the third node and the fourth node;

a ninth acoustic resonator element connected between the first output and the third node; and, a tenth acoustic resonator element connected between the second output and the fourth node.

9. A differential filter comprising:

a first input;

a second input;

a reference voltage input;

a first output;

a second output; and, a plurality of acoustic resonator elements, coupled to the first input, the second input, the first output and the second output, the acoustic resonator elements being arranged to form both a lattice structure and a paired half ladder structure.

10. A differential filter as in claim 9 wherein each of the acoustic resonator elements is a film bulk acoustic resonator (FBAR).

11. A differential filter as in claim 9 wherein each of the acoustic resonator elements is a surface acoustic wave (SAW) element.

12. A differential filter as in claim 9 wherein the plurality of acoustic resonator elements includes:

a first acoustic resonator element connected between the first input and a first node;

a second acoustic resonator element connected between the first input and the second node;

a third acoustic resonator element connected between the second input and the first node;

a fourth acoustic resonator element connected between the second input and the second node;

a fifth acoustic resonator element connected between the first output and the first node;

a sixth acoustic resonator element connected between the second output and the second node;

a seventh acoustic resonator element connected between the first output and the reference voltage input; and, an eighth acoustic resonator element connected between the second output and the reference voltage input.

13. A differential filter as in claim 9 wherein the plurality of acoustic resonator elements includes:

a first acoustic resonator element connected between the first input and a first node;

a second acoustic resonator element connected between the first input and the second node;

a third acoustic resonator element connected between the second input and the first node;

a fourth acoustic resonator element connected between the second input and the second node;

a fifth acoustic resonator element connected between the first node and a third node;

a sixth acoustic resonator element connected between the second node and a fourth node;

a seventh acoustic resonator element connected between the third node and the reference voltage input node;

an eight acoustic resonator element connected between the fourth node and the reference voltage input node;

a ninth acoustic resonator element connected between the first output and the third node;

a tenth acoustic resonator element connected between the second output and the fourth node;

an eleventh acoustic resonator element connected between the first output and the reference voltage input; and, a twelfth acoustic resonator element connected between the second output and the reference voltage input.

14. A differential filter comprising:

a first node;

a second node;

a reference voltage input;

a first output;

a second output; and, a plurality of acoustic resonator elements, coupled to the first node, the second node, the first output and the second output, the acoustic resonator elements being arranged to form both a full ladder structure and a paired half ladder structure, wherein the plurality of acoustic resonator elements includes:

a first acoustic resonator element connected between the first node and the second node, a second acoustic resonator element connected between the first node and a third node, a third acoustic resonator element connected between the second node and a fourth node, a fourth acoustic resonator element connected between the third node and the fourth node, a fifth acoustic resonator element connected between the first output and the third node, a sixth acoustic resonator element connected between the second output and the fourth node, a seventh acoustic resonator element connected between the first output and the reference voltage input, and an eighth acoustic resonator element connected between the second output and the reference voltage input.

15. A differential filter as in claim 14 wherein each of the acoustic resonator elements is a film bulk acoustic resonator (FBAR).

16. A differential filter as in claim 14 wherein each of the acoustic resonator elements is a surface acoustic wave (SAW) element.

17. A differential filter comprising:

a first node;

a second node;

a reference voltage input;

a first output;

a second output; and, a plurality of acoustic resonator elements, coupled to the first node, the second node, the first output and the second output, the acoustic resonator elements being arranged to form both a full ladder structure and a paired half ladder structure, wherein the first node is a first circuit input, the second node is a second circuit input, and the plurality of acoustic resonator elements includes:

a first acoustic resonator element connected between the first node and the second node, a second acoustic resonator element connected between the first node and a third node, a third acoustic resonator element connected between the second node and a fourth node, a fourth acoustic resonator element connected between the third node and the fourth node, a fifth acoustic resonator element connected between a fifth node and the third node, a sixth acoustic resonator element connected between a sixth node and the fourth node, a seventh acoustic resonator element connected between the fifth node and the reference voltage input, an eighth acoustic resonator element connected between the sixth node and the reference voltage input, a ninth acoustic resonator element connected between the fifth node and the first output, a tenth acoustic resonator element connected between the sixth node and the second output, an eleventh acoustic resonator element connected between the first output and the reference voltage input, and a twelfth acoustic resonator element connected between the second output and the reference voltage input.

18. A differential filter as in claim 17 wherein each of the acoustic resonator elements is a film bulk acoustic resonator (FBAR).

19. A differential filter as in claim wherein each of the acoustic resonator elements is a surface acoustic wave (SAW) element.

\* \* \* \* \*